US012751212B2

(12) United States Patent
van der Straten et al.

(10) Patent No.: US 12,751,212 B2
(45) Date of Patent: Sep. 29, 2026

(54) MRAM DEVICE STRUCTURE WITH IMPROVED TOP ELECTRODE

(71) Applicant: INTERNATIONAL BUSINESS MACHINES CORPORATION, Armonk, NY (US)

(72) Inventors: Oscar van der Straten, Guilderland Center, NY (US); Koichi Motoyama, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 491 days.

(21) Appl. No.: 18/046,952

(22) Filed: Oct. 17, 2022

(65) Prior Publication Data

US 2024/0130245 A1 Apr. 18, 2024

(51) Int. Cl.
*H10N 50/80* (2023.01)
*H10B 61/00* (2023.01)
*H10N 50/01* (2023.01)

(52) U.S. Cl.
CPC ............ *H10N 50/80* (2023.02); *H10B 61/00* (2023.02); *H10N 50/01* (2023.02)

(58) Field of Classification Search
CPC ........ H10N 50/80; H10N 50/10; H10B 61/00; G11C 2211/5615; G11C 11/161
See application file for complete search history.

(56) References Cited

U.S. PATENT DOCUMENTS 9,281,168 B2 3/2016 Mudivarthi
9,343,661 B2 5/2016 Deshpande
9,406,875 B2 8/2016 Li
9,450,180 B1 * 9/2016 Annunziata ........... H10N 50/80
9,502,640 B1 11/2016 Annunziata
9,559,294 B2 1/2017 Hsu
9,601,686 B1 * 3/2017 Annunziata ........... H10N 50/80
9,660,179 B1 5/2017 Annunziata
10,522,740 B2 12/2019 Chuang
(Continued)

OTHER PUBLICATIONS

IP.com, "M2001-0043 Process for Formation and use of Amorphous Tantalum Oxynitride Hard mask for Patterning Tunnel Junction Structures", Jul. 9, 2003, IP.com No. IPCOM000016681D, 5 pages.

*Primary Examiner* — Monica D Harrison
*Assistant Examiner* — Jacob T Nelson
(74) *Attorney, Agent, or Firm* — Yuanmin Cai

(57) ABSTRACT

Embodiments of present invention provide a method of forming a structure. The method includes forming a sacrificial dielectric layer on top of a bottom contact; forming a stack of a first ferromagnetic layer, a tunnel barrier layer, a second ferromagnetic layer, and at least one hard mask on top of the sacrificial dielectric layer; forming an interlevel-dielectric (ILD) layer surrounding the stack; creating one or more via holes in the ILD layer to expose the sacrificial dielectric layer; selectively removing the sacrificial dielectric layer to create an opening underneath the first ferromagnetic layer; filling the opening with a first conductive material to form a bottom electrode; removing the at least one hard mask to expose the second ferromagnetic layer; and forming a top electrode of a second conductive material on top of the second ferromagnetic layer. A structure formed thereby is also provided.

11 Claims, 19 Drawing Sheets

(56) References Cited

U.S. PATENT DOCUMENTS

| | | | | |
|---|---|---|---|---|
| 10,529,913 | B1 | 1/2020 | Chen | |
| 10,593,865 | B2 | 3/2020 | Lin | |
| 11,081,642 | B2 | 8/2021 | Shen | |
| 11,107,980 | B2 | 8/2021 | Wu | |
| 11,121,308 | B2 | 9/2021 | Chang | |
| 11,322,543 | B2 | 5/2022 | Chuang | |
| 2009/0209050 | A1 | 8/2009 | Wang | |
| 2011/0049655 | A1 | 3/2011 | Assefa | |
| 2020/0217735 | A1* | 7/2020 | Mehta | H10N 50/01 |
| 2020/0321394 | A1* | 10/2020 | Hashemi | H10B 61/10 |
| 2021/0159270 | A1* | 5/2021 | Reznicek | H10N 50/80 |
| 2022/0069201 | A1 | 3/2022 | Yin | |

* cited by examiner

MRAM DEVICE STRUCTURE WITH IMPROVED TOP ELECTRODE

BACKGROUND

The present application relates to manufacturing of semiconductor integrated circuits. More particularly, it relates to method of forming a magnetoresistive random-access memory and the structure formed thereby.

With the explosion of digital information, semiconductor memory devices are playing an ever increasingly important role in the managing and organizing of this digital information through, for example, storing, retrieving, and/or transformation of this digital information. Magnetoresistive random-access memory (MRAM) is a type of non-volatile memory (NVM) capable of holding saved data even in the event that power to the memory device is down or is accidentally cut off. There have been several recent developments in the technology that allow MRAM to be used successfully in specific emerging applications, as well as in not-so-new ones.

MRAM technology is based on a component known as magnetic tunnel junction (MTJ) that consists of two ferromagnetic layers separated by an insulating layer knows as a tunnel barrier layer. In a vertical MRAM device, a top and a bottom electrode may sometimes compliment the MTJ to form a vertical MTJ stack. The vertical MTJ stack is usually formed by the patterning of a stack of blanket layers corresponding to the above MTJ stack. In other words, the stack of blanket layers may be etched through a reactive ion etch (RIE) and/or ion beam etching (IBE) process. However, such etching processes may sometimes come with re-sputtering effect, which causes metal elements from, for example, the blanket bottom electrode layer to be re-deposited onto sidewall surfaces of the ferromagnetic layers and/or the tunnel barrier layer that are above the bottom electrode layer, resulting shorts between the two ferromagnetic layers that should be otherwise isolated from each other by the tunnel barrier layer. Moreover, the hard masks used in the RIE and/or IBE etching processes are usually made of polycrystalline metal which is subsequently used as a top electrode. However, grain boundaries and defects in the polycrystalline metal hard mask may be transferred into the MTJ stack during the patterning process, resulting in a MTJ stack with high circular edge roughness (CER). The high CER of the MTJ stack negatively impacts the MRAM device performance.

SUMMARY

Embodiments of present invention provide a MRAM structure. The MRAM structure includes a magnetic tunnel junction (MTJ) stack, the MTJ stack includes, from a bottom to a top thereof, a bottom electrode; a first ferromagnetic layer; a tunnel barrier layer; a second ferromagnetic layer; and a top electrode, wherein the top electrode has a first portion directly above the second ferromagnetic layer and a second portion vertically outside the second ferromagnetic layer, and a bottom surface of the first portion of the top electrode and a bottom surface of the second portion of the top electrode are at two different levels.

In one embodiment, the second portion of the top electrode is separated from the second ferromagnetic layer by a dielectric liner.

In another embodiment, the MRAM structure further includes a dielectric liner, the dielectric liner lining a sidewall of the first ferromagnetic layer, a sidewall of the tunnel barrier layer, and a sidewall of the second ferromagnetic layer, the dielectric liner being directly above the bottom electrode.

In yet another embodiment, the MTJ stack of the MRAM structure is surrounded by an interlevel-dielectric (ILD) layer, the ILD layer having one or more via holes that are partially filled with a part of the second portion of the top electrode.

In one embodiment, the top electrode has a same material composition as the bottom electrode.

In another embodiment, the MRAM structure further includes a bottom contact and a conductive cap between the bottom electrode and the bottom contact, wherein the bottom contact is a metal level of a back-end-of-line (BEOL) structure.

Embodiments of present invention further provide a method of forming a MRAM structure. The method includes forming a sacrificial dielectric layer on top of a bottom contact; forming a stack of layers on top of the sacrificial dielectric layer, wherein the stack of layers includes, from a bottom to a top thereof, a first ferromagnetic layer, a tunnel barrier layer, a second ferromagnetic layer, and at least one hard mask; forming an interlevel-dielectric (ILD) layer surrounding the stack; creating one or more via holes in the ILD to expose the sacrificial dielectric layer; selectively removing the sacrificial dielectric layer to create an opening underneath the first ferromagnetic layer; filling the opening with a first conductive material to form a bottom electrode; removing the at least one hard mask to expose the second ferromagnetic layer; and forming a top electrode of a second conductive material on top of the second ferromagnetic layer, the top electrode being surrounded by the ILD layer.

In one embodiment, forming the top electrode further includes depositing the second conductive material partially into the one or more via holes in the ILD layer to form a part of the top electrode.

In another embodiment, filling the opening with the first conductive material further includes filling the opening through the one or more via holes with the first conductive material, thereby filling the one or more via holes with the first conductive material.

In one embodiment, the method further includes removing the first conductive material from the one or more via holes and subsequently filling the one or more via holes with a dielectric material to a level that is above the tunnel barrier layer.

In another embodiment, forming the stack of layers includes forming a stack of a blanket first ferromagnetic layer, a blanket tunnel barrier layer, a blanket second ferromagnetic layer, and at least one blanket hard mask layer; patterning the at least one blanket hard mask layer into the at least one hard mask; and using the at least one hard mask in an anisotropic etching process to etch the blanket first ferromagnetic layer, the blanket tunnel barrier layer, and the blanket second ferromagnetic layer into the first ferromagnetic layer, the tunnel barrier layer, and the second ferromagnetic layer.

In one embodiment, the method further includes forming a dielectric liner lining a sidewall of the first ferromagnetic layer, a sidewall of the tunnel barrier layer, a sidewall of the second ferromagnetic layer, and a sidewall of the at least one hard mask.

In one embodiment, forming the sacrificial dielectric layer includes forming a blanket sacrificial dielectric layer on top of the bottom contact; and using the stack of layers of the first ferromagnetic layer, the tunnel barrier layer, the second ferromagnetic layer, and the at least one hard mask, together with the dielectric liner at the sidewalls thereof in an anisotropic etching process to etch the blanket sacrificial dielectric layer into the sacrificial dielectric layer.

BRIEF DESCRIPTION OF THE DRAWINGS

The present invention will be understood and appreciated more fully from the following detailed description of embodiments of present invention, taken in conjunction with accompanying drawings of which.

Figure 1:
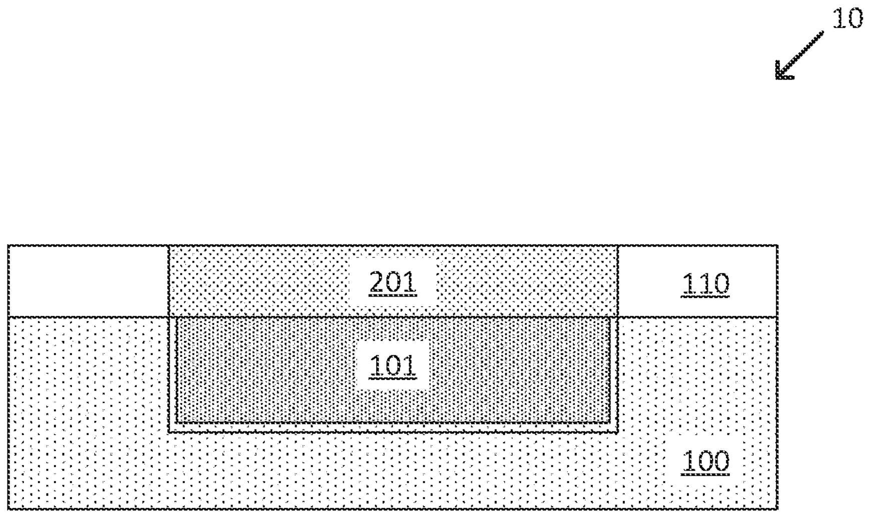
FIGS. 1-18 are demonstrative illustrations of cross-sectional views of a MRAM device in steps of manufacturing thereof according to various embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a MRAM device in a step of manufacturing thereof according to one embodiment of present invention. The MRAM device may be a MRAM structure 10 (see FIG. 18 for more details) and may include one or more magnetic tunnel junction (MTJ) stacks. In one embodiment, the MTJ stacks may have a substantially cylindrical form or shape when being viewed from a top thereof, although other forms or shapes are possible and are fully contemplated here as well. It is to be understood here that cross-sectional views of the MRAM device illustrated hereinafter may be views of cross-sections made substantially along a diameter of the MTJ stacks, in the case that the MTJ stacks have a substantially cylindrical form.

More particularly, embodiments of present invention provide receiving a supporting structure such as a dielectric material layer 100 therewithin there may be embedded a metal level 101. In one embodiment, this supporting structure may be, for example, a part of a back-end-of-line (BEOL) structure of a semiconductor chip and the semiconductor chip may include other semiconductor structures and elements such as, for example, front-end-of-line (FEOL) structures and middle-of-line (MOL) structures (now shown). The metal level 101 may be, for example, a metal level 2 (M2), a metal level 3 (M3), etc., and may be made of a layer of conductive material such as, for example, copper (Cu), cobalt (Co), tungsten (W), aluminum (Al), ruthenium (Ru) and other suitable conductive materials. The metal level 101 may function or serve as a bottom contact of the MRAM structure 10 under manufacturing and thus may be referred to as a bottom contact 101 as well.

Embodiments of present invention may further provide forming a conductive cap 201 on top of the bottom contact 101 with the conductive cap 201 embedded or surrounded by a dielectric material layer 110. In forming the above structure, one embodiment of present invention may include first depositing a layer of conductive material on top of the supporting structure, and then patterning the layer of conductive material into the conductive cap 201. After the patterning, a dielectric material may be deposited to surround the conductive cap 201 and the dielectric material may subsequently be planarized through a chemical-mechanic-polishing (CMP) process to form the dielectric material layer 110. Alternatively, another embodiment of present invention may include first depositing the dielectric material layer 110 on top of the supporting structure and then patterning the dielectric material layer 110 to create an opening directly above and exposing the bottom contact 101. Subsequently the opening may be filled with a conductive material, followed by a CMP process, to form the conductive cap 201. In addition to the above embodiments, other known or future developed methods and/or processes may be used as well to form the conductive cap 201 and to surround the conductive cap 201 with the dielectric material layer 110. Although it is illustrated to having the same size, the conductive cap 201 and the bottom contact 101 may not necessarily have the same size.

Figure 2:
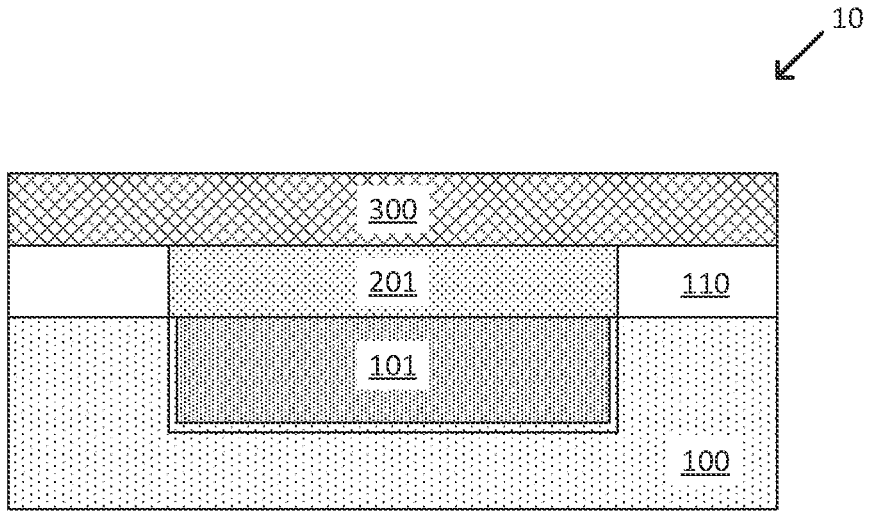

FIG. 2 is a demonstrative illustration of cross-sectional view of a MRAM device in a step of manufacturing thereof, following the step illustrated in FIG. 1, according to one embodiment of present invention. More particularly, embodiments of present invention provide forming a blanket sacrificial dielectric layer 300 on top of the conductive cap 201 and the surrounding dielectric material layer 110. The blanket sacrificial dielectric layer 300 may be formed through, for example, a chemical-vapor-deposition (CVD) process, a physical-vapor-deposition (PVD) process, an atomic-layer-deposition (ALD) process, or any other suitable means and/or processes. The blanket sacrificial dielectric layer 300 may be deposited or formed to have a thickness ranging from about 5 nm to about 50 nm. The blanket sacrificial dielectric layer 300, and the subsequently formed sacrificial dielectric layer, may be formed as a placeholder for the forming a bottom electrode, as being described below in more details.

Figure 3:
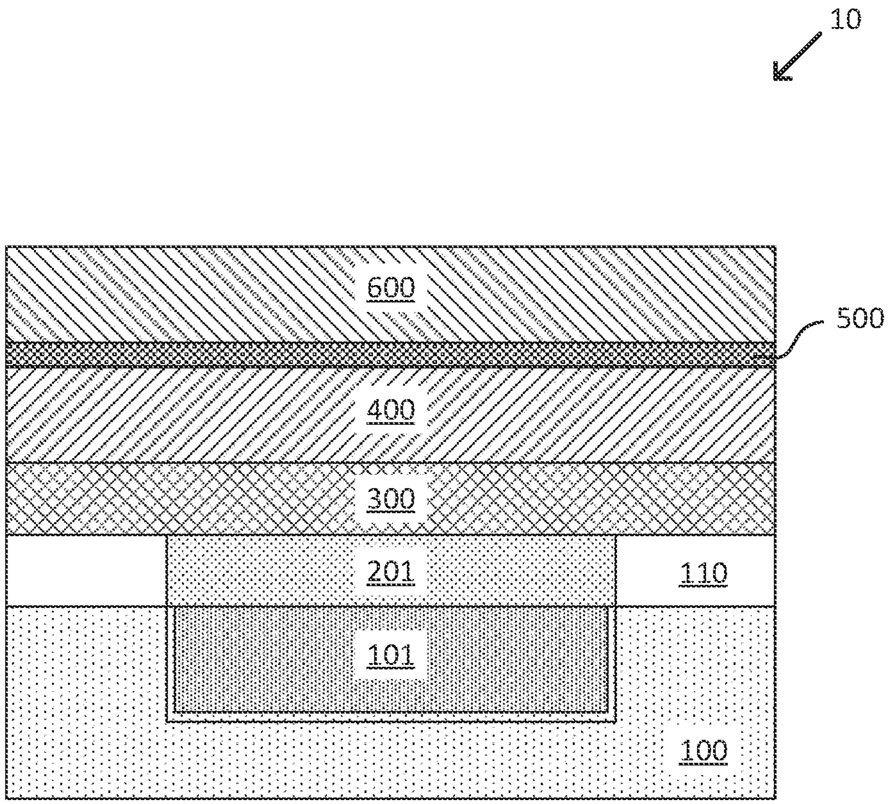

FIG. 3 is a demonstrative illustration of cross-sectional view of a MRAM device in a step of manufacturing thereof, following the step illustrated in FIG. 2, according to one embodiment of present invention. More particularly, embodiments of present invention provide forming a blanket first ferromagnetic layer 400 on top of the blanket sacrificial dielectric layer 300, a blanket tunnel barrier layer 500 on top of the blanket first ferromagnetic layer 400, and a blanket second ferromagnetic layer 600 on top of the blanket tunnel barrier layer 500. Hereinafter, the blanket first ferromagnetic layer 400, the blanket tunnel barrier layer 500, and the blanket second ferromagnetic layer 600 may together, collectively, be referred to as a blanket MTJ layer.

In one embodiment, the blanket first ferromagnetic layer 400 and the blanket second ferromagnetic layer 600 may be, independently, a layer of cobalt (Co), iron (Fe), and boron (B) based material (CoFeB) such as, for example, an alloy of Co, Fe, and B. However, embodiments of present invention are not limited in this aspect and the blanket first ferromagnetic layer 400 and the blanket second ferromagnetic layer 600 may be of other suitable materials such as, for example, an alloy of Co and Fe (CoFe) or an alloy of nickel (Ni) and Fe (NiFe). The blanket first ferromagnetic layer 400 may be formed to have a thickness ranging from about 2 nm to about 30 nm, and the blanket second ferromagnetic layer 600 may be formed to have a thickness ranging from about 2 nm to about 30 nm. A thickness less than 2 nm or more than 30 nm is also acceptable. In one embodiment, it is possible that the blanket first ferromagnetic layer 400 and/or the blanket second ferromagnetic layer 600 may include a blanket Co-based synthetic antiferromagnetic layer as a part thereof, depending on whether the first ferromagnetic layer 400 or the blanket second ferromagnetic layer 600 is used as a reference layer of the MRAM structure 10.

In another embodiment, the blanket tunnel barrier layer 500 may be a layer of magnesium-oxide (MgO) or other suitable materials such as, for example, aluminum-oxide ($Al_2O_3$) and/or titanium-oxide ($TiO_2$) and may be formed to have a thickness ranging from about 0.6 nm to about 1.2 nm.

Figure 4:
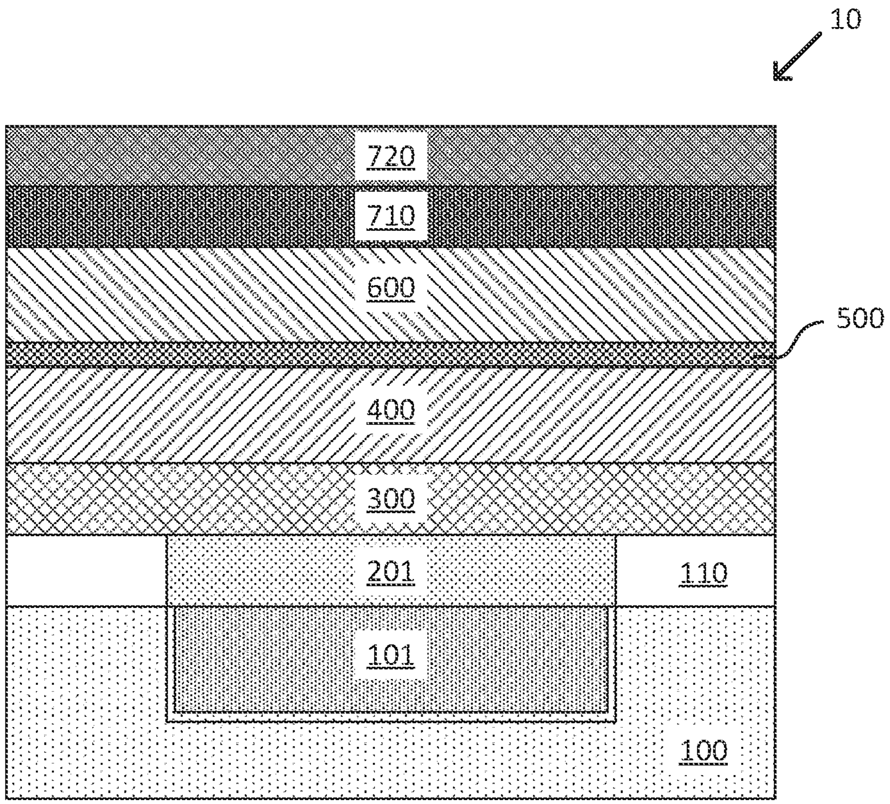

FIG. 4 is a demonstrative illustration of cross-sectional view of a MRAM device in a step of manufacturing thereof, following the step illustrated in FIG. 3, according to one embodiment of present invention. More particularly, embodiments of present invention provide forming a hard mask layer on top of the MTJ layer or, more specifically, on top of the blanket second ferromagnetic layer 600. For example, in one embodiment the hard mask layer may include a first hard mask layer 710 and, in another embodiment, the hard mask layer may include both the first hard mask layer 710 and a second hard mask layer 720 which is on top of the first hard mask layer 710. The first hard mask layer 710 and the second hard mask layer 720 may have different material composition such as different dielectric materials, thus different etch selectivity. For example, the first hard mask layer 710 may be silicon-oxide (SiO) and the second hard mask layer 720 may be silicon-nitride (SiN). The first and second hard mask layers 710 and 720 may be formed through a deposition process such as, for example, a CVD, PVD, or ALD process. The hard mask layer may have a thickness ranging from about 5 nm to about 50 nm, which is a thickness of the first hard mask layer 710 in the first embodiment or a combined thickness of the first and second hard mask layers 710 and 720 in the second embodiment. Here, for the sake of description, both the first hard mask layer 710 and the second hard mask layer 720 are illustrated as being used in the process. Using two different hard mask layers 710 and 720 may enhance the robustness of the MRAM device manufacturing process, as being described below in more details.

Figure 5:
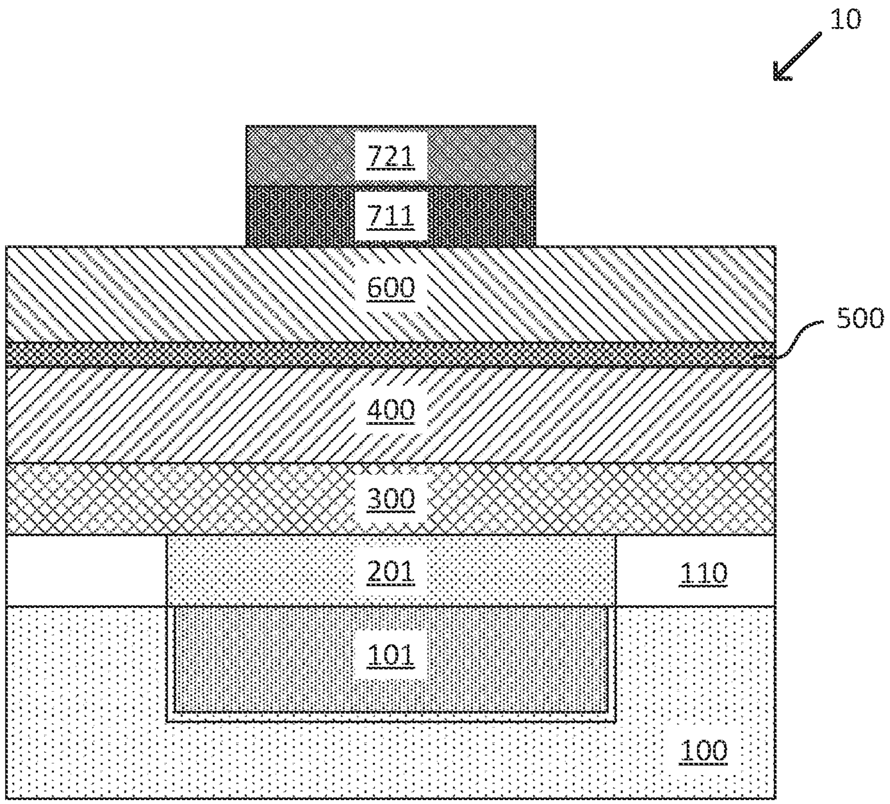

FIG. 5 is a demonstrative illustration of cross-sectional view of a MRAM device in a step of manufacturing thereof, following the step illustrated in FIG. 4, according to one embodiment of present invention. More particularly, embodiments of present invention provide patterning the first and second hard mask layers 710 and 720 into a hard mask having a first hard mask 711 and a second hard mask 721. The patterning of the first and second hard mask layers 710 and 720 may be made through a lithographic patterning and etching process. For example, a mask pattern representing a top view of the MRAM structure may first be formed on top of the second hard mask layer 720. A reactive-ion-etching (RIE) process may subsequently be applied, using the mask pattern, to etch the first and second hard mask layers 710 and 720, thereby resulting in the first and second hard masks 711 and 721.

Figure 6:
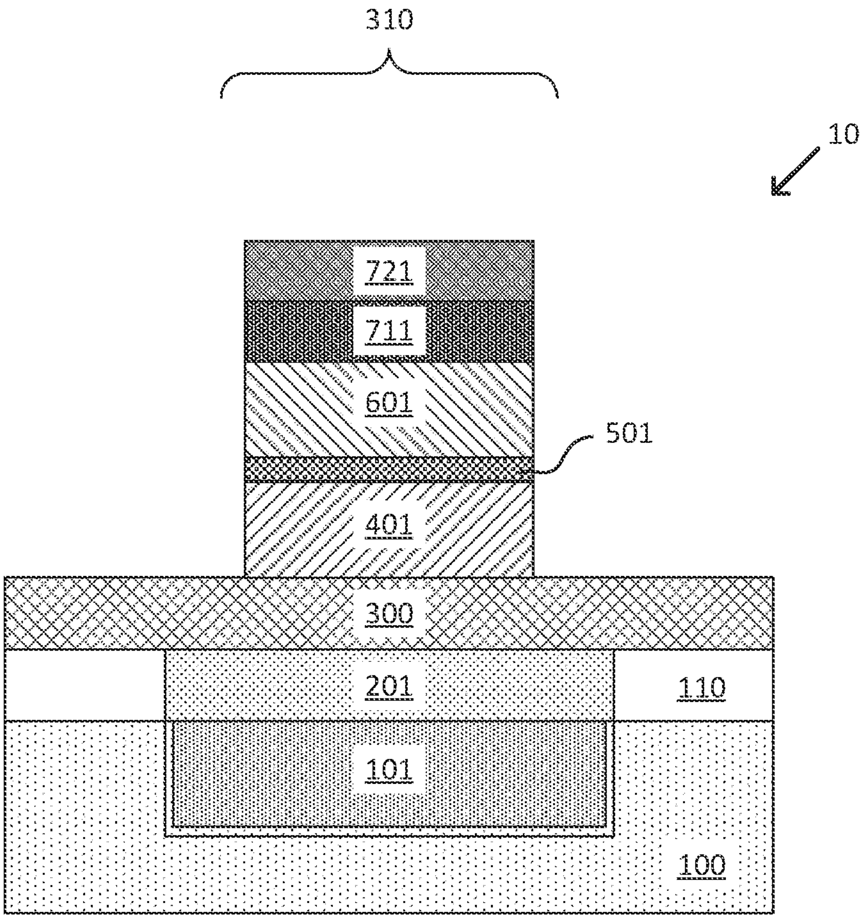
Figure 17:
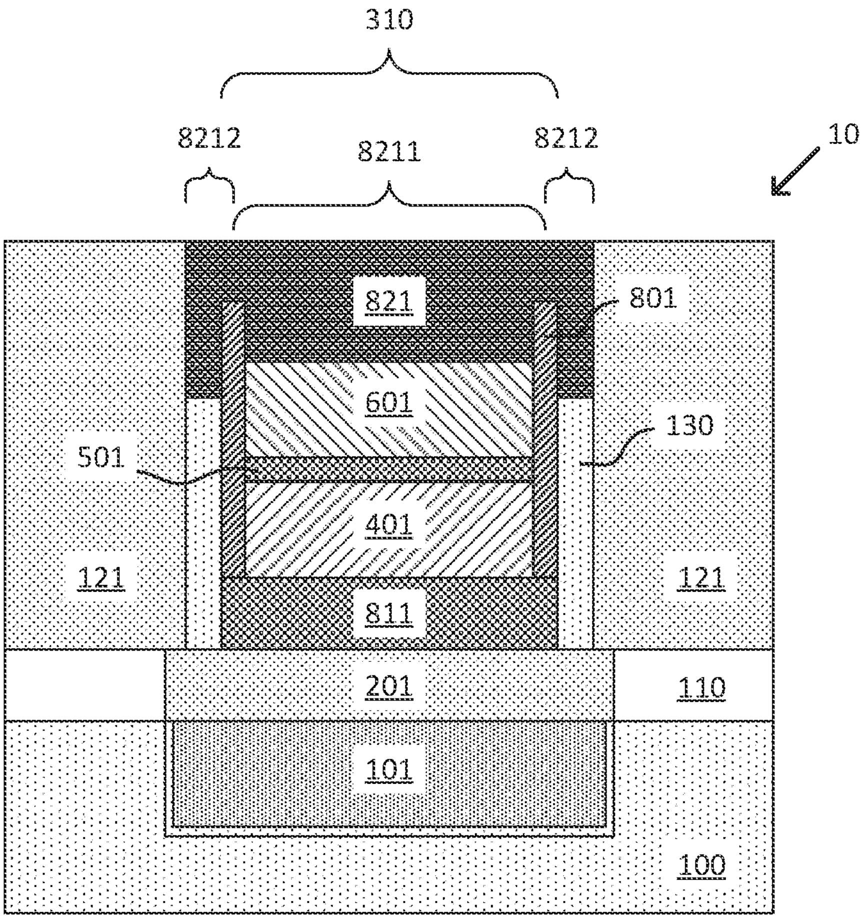

FIG. 6 is a demonstrative illustration of cross-sectional view of a MRAM device in a step of manufacturing thereof, following the step illustrated in FIG. 5, according to one embodiment of present invention. More particularly, embodiments of present invention provide using the hard mask of the first and second hard masks 711 and 721 (or the first hard mask 711 when only one hard mask is used) in an anisotropic and/or directional etching process to etch the underneath blanket second ferromagnetic layer 600, the blanket tunnel barrier layer 500, and the blanket first ferromagnetic layer 400 of the blanket MTJ layer. The etching process may therefore produce a second ferromagnetic layer 601, a tunnel barrier layer 501, and a first ferromagnetic layer 401, which form part of a MTJ stack 310. As is used hereinafter, the MTJ stack 310 refers to a structure that includes a bottom electrode 811, the first ferromagnetic layer 401, the tunnel barrier layer 501, the second ferromagnetic layer 601, and a top electrode 821 as is illustrated in FIG. 17. The etching process of the blanket MTJ layer may stop at the blanket sacrificial dielectric layer 300.

Among the various layers in the MTJ stack 310, and depending on applications, in one embodiment the first ferromagnetic layer 401 may be a reference layer and the second ferromagnetic layer 601 may be a free layer. In another embodiment the first ferromagnetic layer 401 may be a free layer and the second ferromagnetic layer 601 may be a reference layer. As is described above, in some embodiment a reference layer may also include a Co-based synthetic anti-ferromagnetic layer, in addition to being a ferromagnetic layer.

According to embodiments of present invention, because the hard mask used in the etching process is not planned to be used as a top electrode later, the hard mask is not made of polycrystalline metal. For example, the first hard mask 711 and/or the second hard mask 721 are made of dielectric materials that are in amorphous state. The use of amorphous dielectric material (as hard masks) greatly reduces the circular edge roughness (CER) of the MTJ stack produced. This is particularly significant when they are compared with the high CER of MTJ stacks that are produced with the use of polycrystalline metal hard mask such as those hard masks used in the currently existing art.

Figure 7:
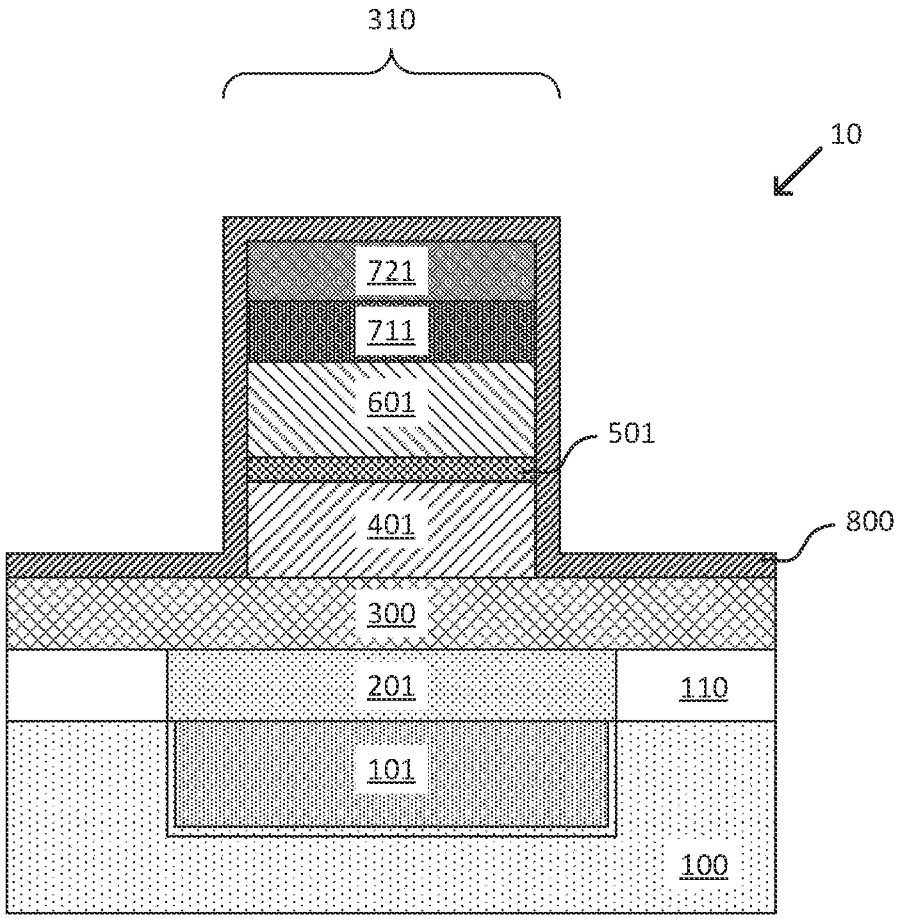

FIG. 7 is a demonstrative illustration of cross-sectional view of a MRAM device in a step of manufacturing thereof, following the step illustrated in FIG. 6, according to one embodiment of present invention. More particularly, embodiments of present invention provide forming an encapsulation layer 800 covering the stack of layers including the first and second hard masks 711 and 721, the first and second ferromagnetic layers 401 and 601, and the tunnel barrier layer 501. The encapsulation layer 800 may also cover a top surface of the sacrificial dielectric layer 300. The encapsulation layer 800 may be a conformal dielectric liner of, for example, SiN, SiCN, SiOCN, SiON, AlON, $Al_2O_3$, $ZrO_2$, and $SiO_2$ and may be formed through, for example, a CVD, PVD, or ALD process to have a thickness ranging from about 1 nm to about 10n.

Figure 8:
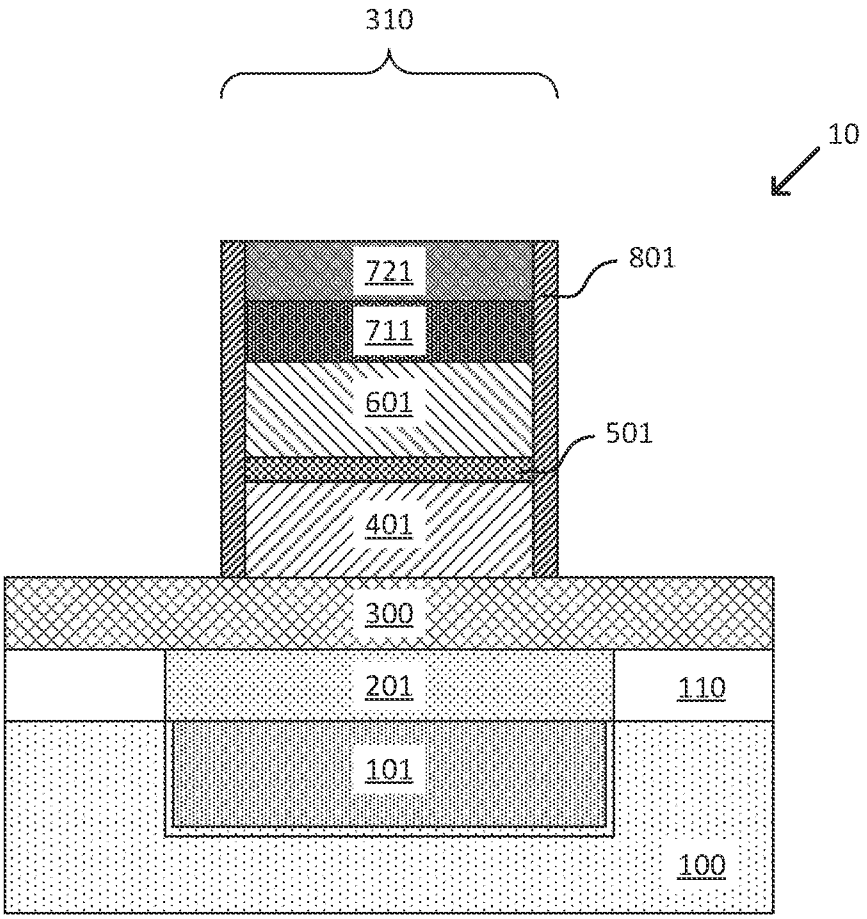

FIG. 8 is a demonstrative illustration of cross-sectional view of a MRAM device in a step of manufacturing thereof, following the step illustrated in FIG. 7, according to one embodiment of present invention. More particularly, embodiments of present invention provide applying an anisotropic and/or directional etching process such as, for example, a RIE process to remove portions of the encapsulation layer 800 that are substantially horizontal such as the horizontal portion above the second hard mask 721 and the horizontal portion above the blanket sacrificial dielectric layer 300. The anisotropic etching process may cause a vertical portion of the encapsulation layer 800 to remain and become a dielectric liner 801. The dielectric liner 801 may surround sidewalls of the first and second hard masks 711 and 721, sidewalls of the first and second ferromagnetic layers 401 and 601, and a sidewall of the tunnel barrier layer 501 to protect the first and second ferromagnetic layers 401 and 601 from oxidation and other possible contaminations.

Figure 9:
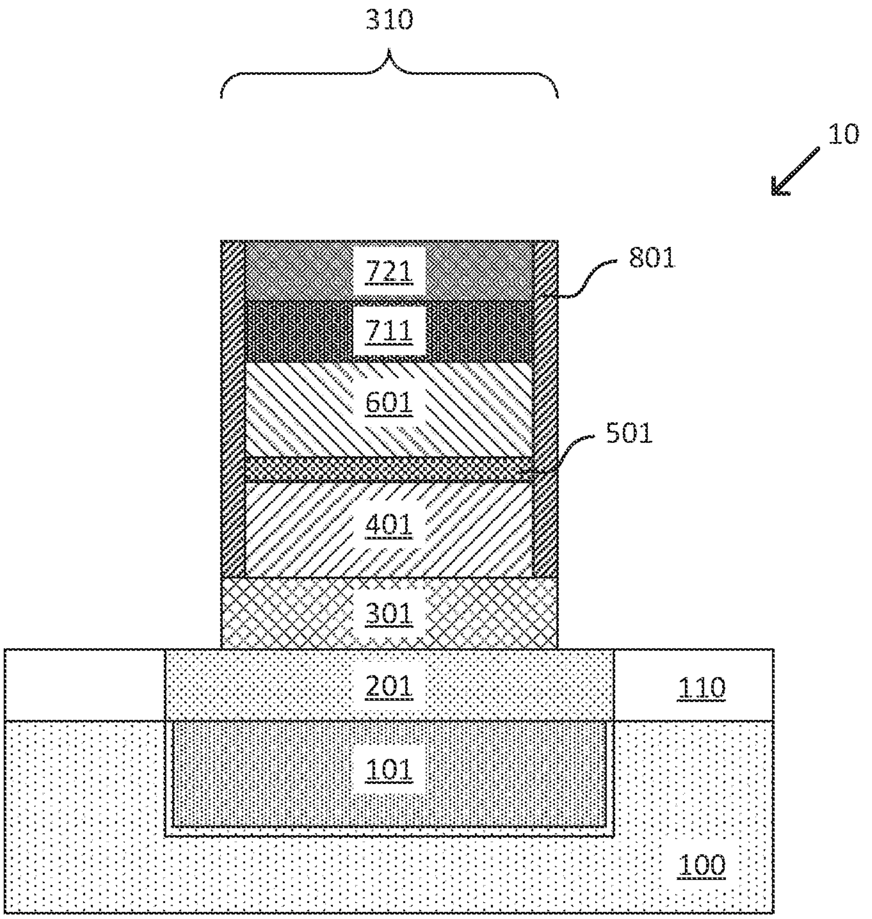

FIG. 9 is a demonstrative illustration of cross-sectional view of a MRAM device in a step of manufacturing thereof, following the step illustrated in FIG. 8, according to one embodiment of present invention. More particularly, embodiments of present invention provide etching the blanket sacrificial dielectric layer 300 using the dielectric liner 801 and the stack of layers including the first ferromagnetic layer 401, the tunnel barrier layer 501, and the second ferromagnetic layer 601 as an etch mask, resulting only a portion of the blanket sacrificial dielectric layer 300 that are directly underneath the first ferromagnetic layer 401 and the dielectric liner 801 to remain and become a sacrificial dielectric layer 301. As is illustrated in FIG. 9, the dielectric liner 801 is directly above, and substantially aligned with, the sacrificial dielectric layer 301.

Figure 10:
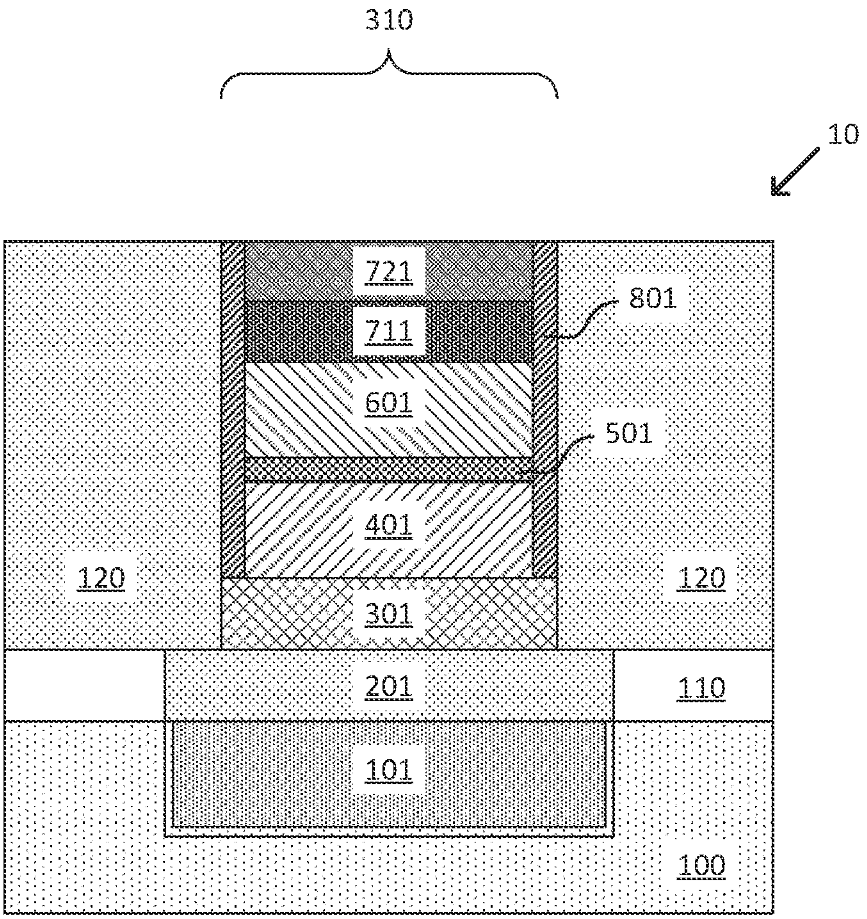

FIG. 10 is a demonstrative illustration of cross-sectional view of a MRAM device in a step of manufacturing thereof, following the step illustrated in FIG. 9, according to one embodiment of present invention. More particularly, embodiments of present invention provide forming a blanket interlevel-dielectric (ILD) layer 120 surrounding the dielectric liner 801, which in-turn surrounds the stack of layers that include the first ferromagnetic layer 401, the tunnel barrier layer 501, the second ferromagnetic layer 601, and the first hard mask 711. In one embodiment the dielectric liner 801 may surround the second hard mask 721 as well. The blanket ILD layer 120 may surround the sacrificial dielectric layer 301.

Figure 11:
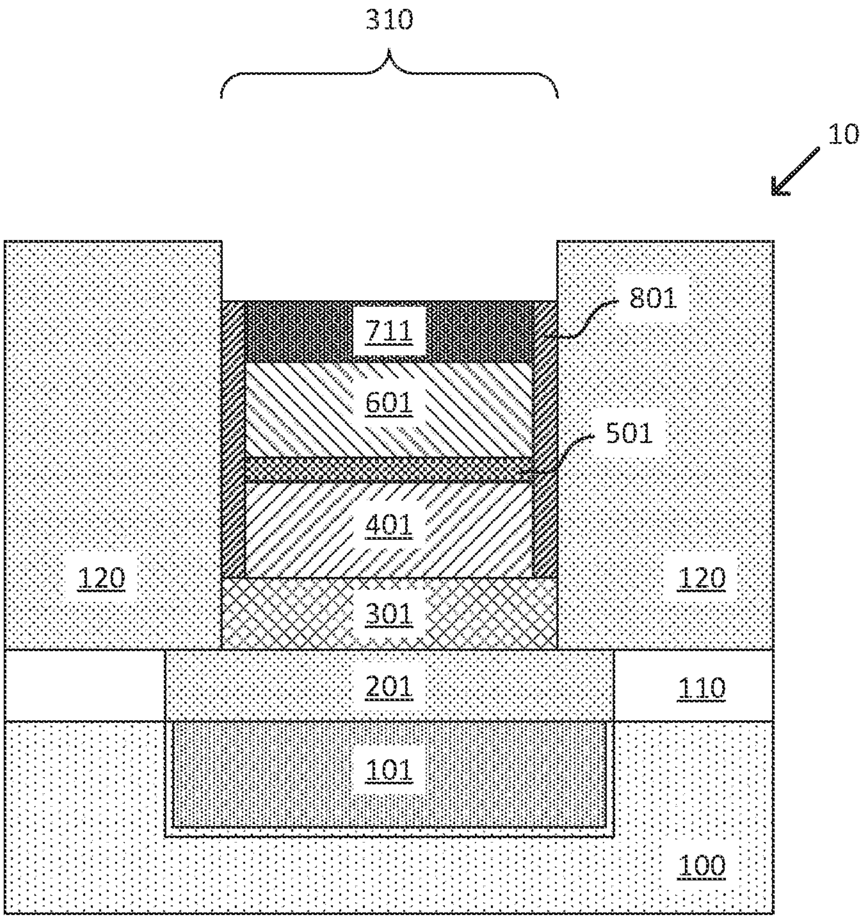

FIG. 11 is a demonstrative illustration of cross-sectional view of a MRAM device in a step of manufacturing thereof, following the step illustrated in FIG. 10, according to one embodiment of present invention. More particularly, embodiments of present invention provide, when the hard mask is made of the first and second hard masks 711 and 721, applying a selective etching process to remove the second hard mask 721 and a portion of the dielectric liner 801 that surrounds the second hard mask 721. Since the first hard mask 711 is materially different from the second hard mask 721 to have different etch selectivity, the etching process of the second hard mask 721 may stop at the first hard mask 711 which provide better protection for the underneath second ferromagnetic layer 601. However, this step may be skipped when the hard mask is made of one hard mask such as only the first hard mask 711.

Figure 12:
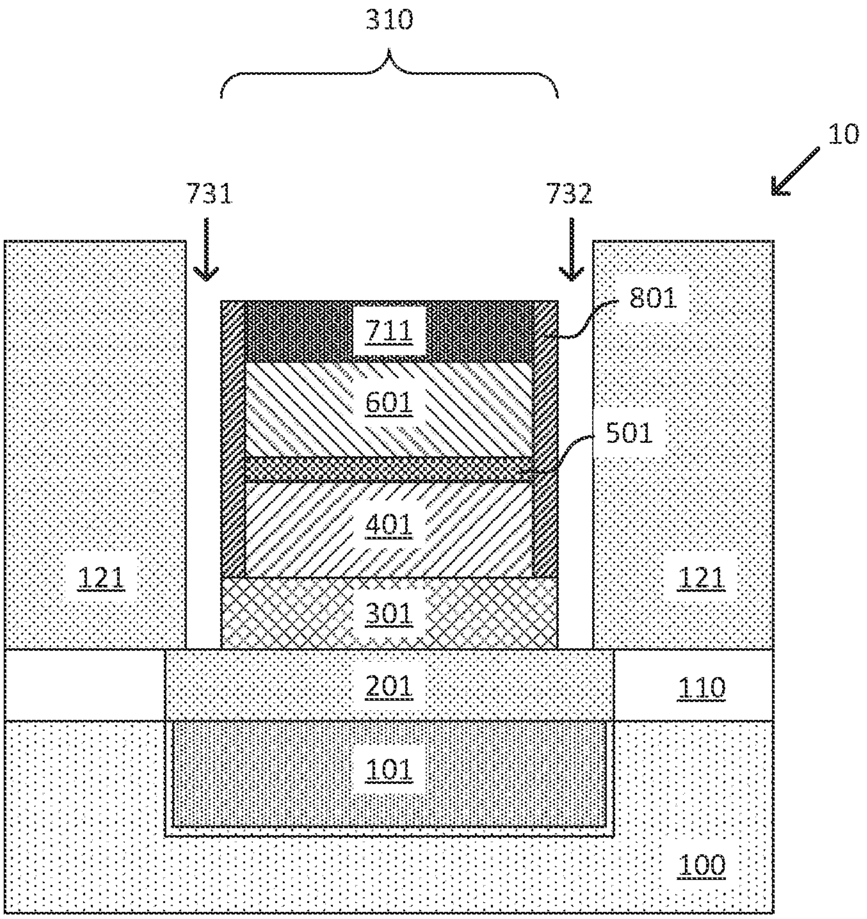

FIG. 12 is a demonstrative illustration of cross-sectional view of a MRAM device in a step of manufacturing thereof, following the step illustrated in FIG. 11, according to one embodiment of present invention. More particularly, embodiments of present invention provide forming one or more via holes, such as via holes 731 and 732, in the blanket ILD layer 120 resulting in an ILD layer 121 that includes one or more via openings. The one or more via holes 731 and 732 in the ILD layer 121 may expose the underneath sacrificial dielectric layer 301 and, in one embodiment, may be made immediately next to, and surrounding, the MTJ stack 310. In other words, the one or more via holes 731 and 732 in the ILD layer 121 may be made immediately next to the dielectric liner 801 and to a sidewall of the sacrificial dielectric layer 301 to expose the sacrificial dielectric layer 301. It is to be noted here that the one or more via holes 731 and 732 are not formed continuously around the MTJ stack 310 and/or the dielectric liner 801. Rather, portions of the ILD layer 121 are still immediately adjacent to the MTJ stack 310 and/or the dielectric liner 801. The one or more via holes 731 and 732 provide a pathway such that the sacrificial dielectric layer 301 underneath the first ferromagnetic layer 401 may be accessed and thus etched by some dry or wet etching process, as is described below in more details.

Figure 13:
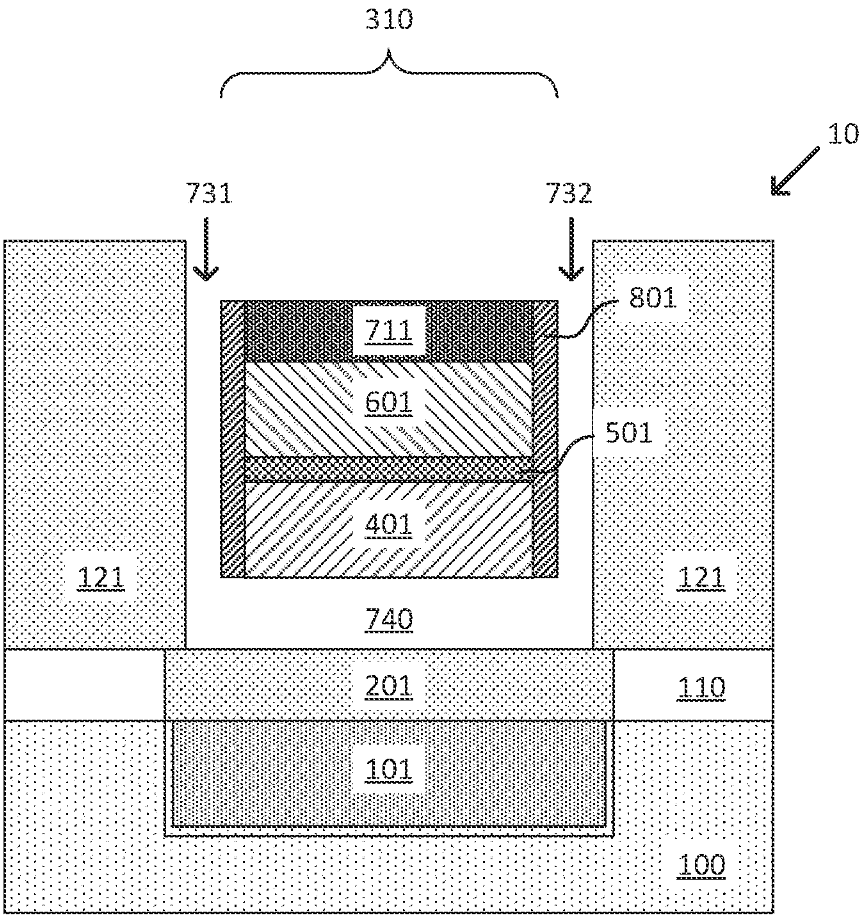

FIG. 13 is a demonstrative illustration of cross-sectional view of a MRAM device in a step of manufacturing thereof, following the step illustrated in FIG. 12, according to one embodiment of present invention. More particularly, embodiments of present invention provide performing a selective etching process to remove the sacrificial dielectric layer 301. This selective etching process may be a dry etching process such as a RIE process or a wet etching process that uses etchant such as dilute HF. The portions of the ILD layer 121 that are immediately adjacent to the MTJ stack 310 may hold the MTJ stack 310 in place, preventing the MTJ stack 310 from collapsing, enabling the removal of the dielectric material of the sacrificial dielectric layer 301 below the first ferromagnetic layer 401 and above the conductive cap 201. This selective etching process thus creates an opening 740 underneath the first ferromagnetic layer 401.

Figure 14:
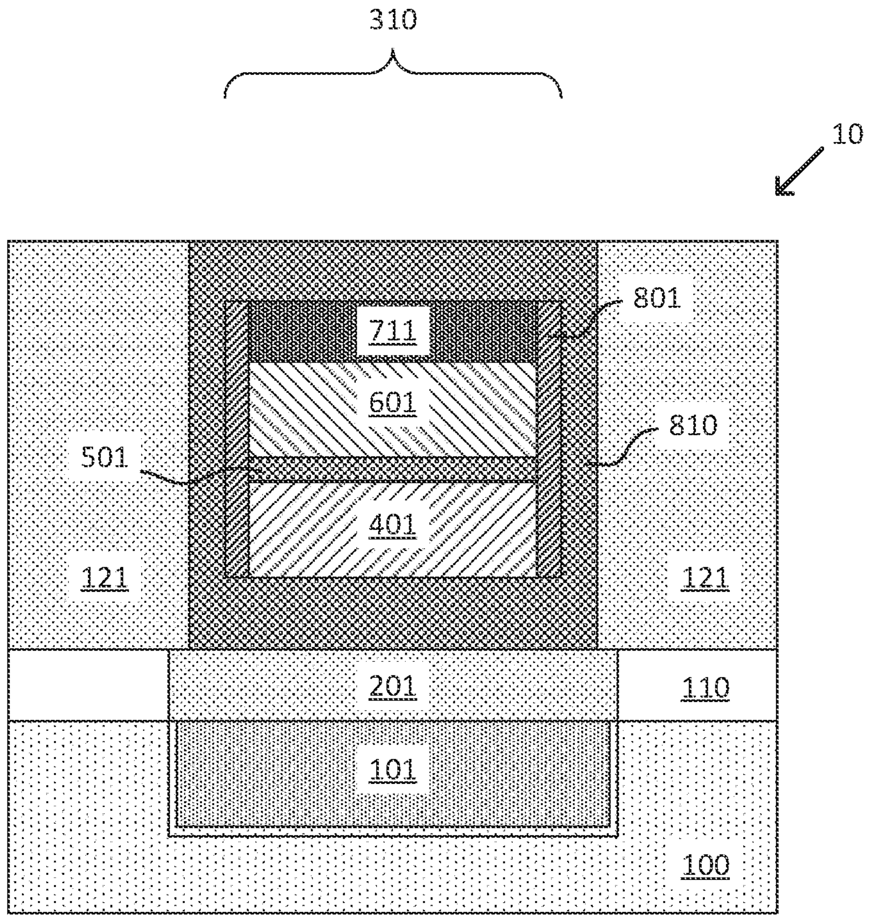

FIG. 14 is a demonstrative illustration of cross-sectional view of a MRAM device in a step of manufacturing thereof, following the step illustrated in FIG. 13, according to one embodiment of present invention. More particularly, embodiments of present invention provide filling the opening 740, through the one or more via holes such as via holes 731 and 732, with a first conductive material 810 that is suitable as a material for the bottom electrode of the MTJ stack 310. For example, the first conductive material 810 may be tantalum-nitride (TaN), titanium-nitride (TiN) or other conductive materials. The first conductive material 810 may be deposited through, for example, a CVD or an ALD process. In one embodiment, the one or more via holes 731 and 732, and the top of the hard mask 711, may be filled with the first conductive material as well during the process of filling the opening 740 with the first conductive material.

Figure 15:
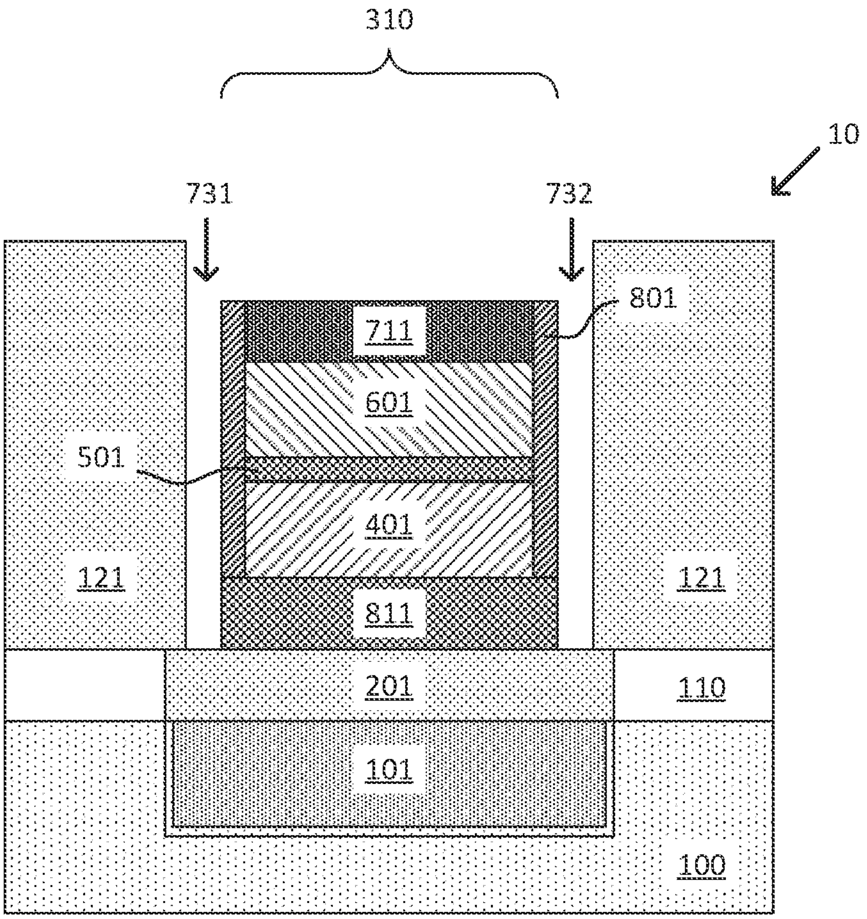

FIG. 15 is a demonstrative illustration of cross-sectional view of a MRAM device in a step of manufacturing thereof, following the step illustrated in FIG. 14, according to one embodiment of present invention. More particularly, embodiments of present invention provide selectively removing the first conductive material 810 in areas other than underneath the first ferromagnetic layer 401. For example, the first conductive material 810 may be selectively removed from the one or more via holes 731 and 732 using one or more selective dry etching or wet etching processes. More particularly, an anisotropic and/or directional etching process such as a RIE process or an IBE process may be employed to remove the first conductive material 810 from the one or more via holes 731 and 732, leaving behind only a portion of the first conductive material 810 that is directly underneath the first ferromagnetic layer 401 and the dielectric liner 801, thereby forming a bottom electrode 811.

Figure 16:
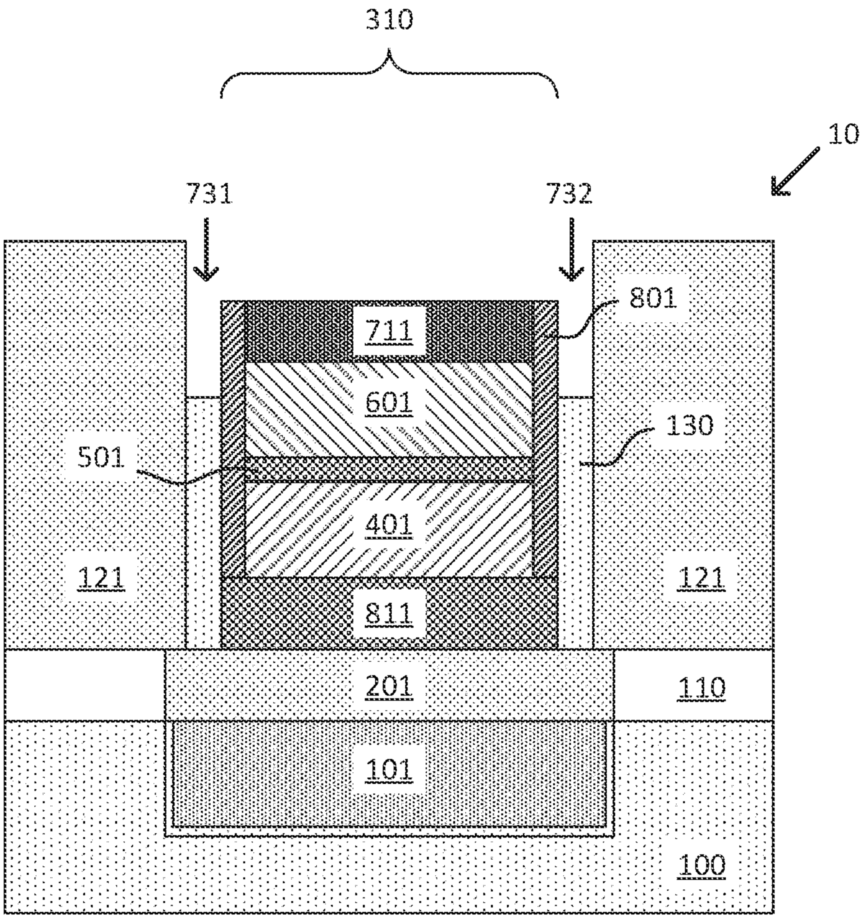

FIG. 16 is a demonstrative illustration of cross-sectional view of a MRAM device in a step of manufacturing thereof, following the step illustrated in FIG. 15, according to one embodiment of present invention. More particularly, embodiments of present invention provide, after forming the bottom electrode 811, depositing a dielectric material layer 130 to re-fill all of the via holes such as the one or more via holes 731 and 732 that surround the MTJ stack 310. The dielectric material layer 130 may be deposited through, for example, a CVD, PVD, or ALD process to a height level that is at least above the tunnel barrier layer 501 to ensure that a top electrode to be formed thereupon may not cause short between the first and second ferromagnetic layers 401 and 601. For example, the dielectric material layer 130 may be deposited to have a height that is somewhere next to the sidewall of the second ferromagnetic layer 601, separated by the dielectric liner 801.

FIG. 17 is a demonstrative illustration of cross-sectional view of a MRAM device in a step of manufacturing thereof, following the step illustrated in FIG. 16, according to one embodiment of present invention. More particularly, embodiments of present invention provide removing the first hard mask 711 through a selective etching process to expose the top surface of the second ferromagnetic layer 601. Depending on any difference in material composition between the first hard mask 711 and the dielectric liner 801, should both be made of the same dielectric material (such as in the embodiment where the hard mask includes only the first hard mask 711), the dielectric liner 801 may be etched as well and lowered in level that is comparable with the top surface of the second ferromagnetic layer 601.

Embodiments of present invention further provide forming a top electrode 821 on top of and in contact with the second ferromagnetic layer 601 by depositing a second conductive material through, for example, a CVD, PVD, or ALD process. The top electrode 821 may be formed, in one embodiment, in between the dielectric liner 801 and in the one or more via holes 731 and 732 in the ILD layer 121. The one or more via holes 731 and 732 may have already been partially filled with the dielectric material layer 130. In other words, the top electrode 821 may be formed to saddle on top of the second ferromagnetic layer 601. The top electrode 821 may be horizontally larger than the second ferromagnetic layer 601 to include a first portion 8211 that is directly on top of the second ferromagnetic layer 601 and a second portion 8212 that is, horizontally, outside the second ferromagnetic layer 601. The first and second portions 8211 and 8212 of the top electrode 821 may have their respective bottom surfaces that are at different height levels. Moreover, the second portion 8212 of the top electrode 821 may be separated from the second ferromagnetic layer 601 by the dielectric liner 801. Overall, the top electrode 821 may be embedded in the ILD layer 121.

In one embodiment, the top electrode may be made of, for example, TaN, TiN, or other conductive materials and may have a same material composition as that of the bottom electrode 811. A CMP process may be applied to planarize the top surface of the top electrode 821 to be coplanar with that of the ILD layer 121.

Figure 18:
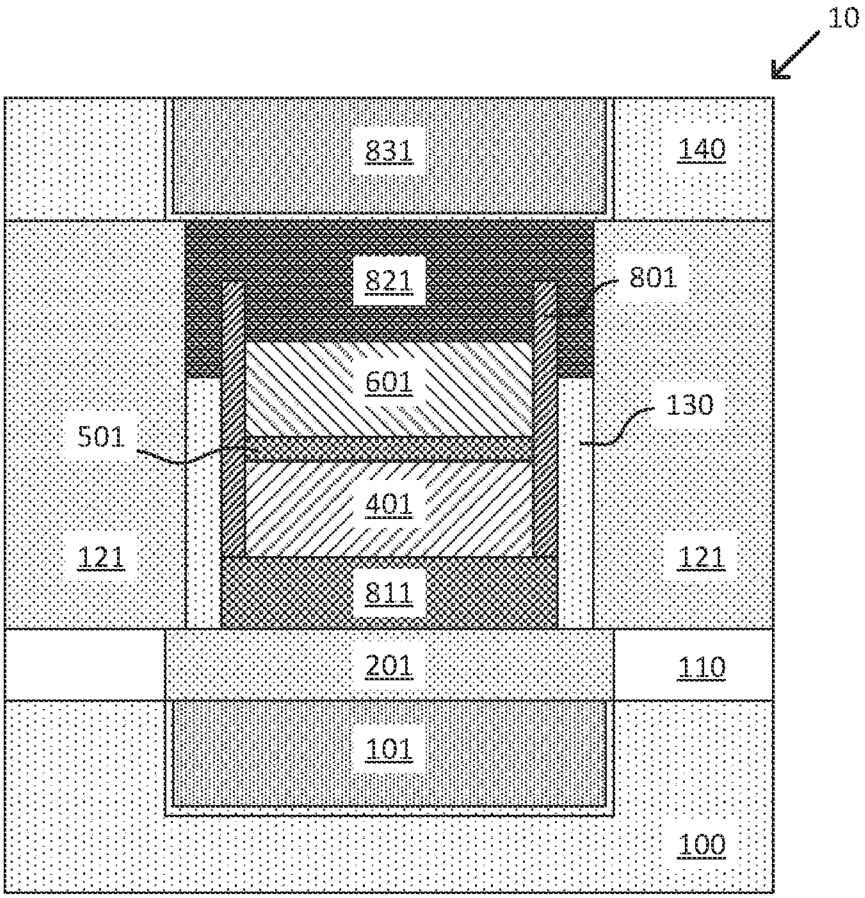

FIG. 18 is a demonstrative illustration of cross-sectional view of a MRAM device in a step of manufacturing thereof, following the step illustrated in FIG. 17, according to one embodiment of present invention. More particularly, embodiments of present invention provide forming a top contact 831 in contact with the top electrode 821. The top contact may be made of, for example, tungsten (W), copper (Cu), aluminum (Al), cobalt (Co), ruthenium (Ru), and other suitable materials that are generally used for forming different metal levels in a BEOL environment. The top contact 831 may be embedded in a dielectric material layer 140. In one embodiment, the top contact 831 may have a flat bottom surface that is in contact with a flat top surface of the top electrode 821.

Figure 19:
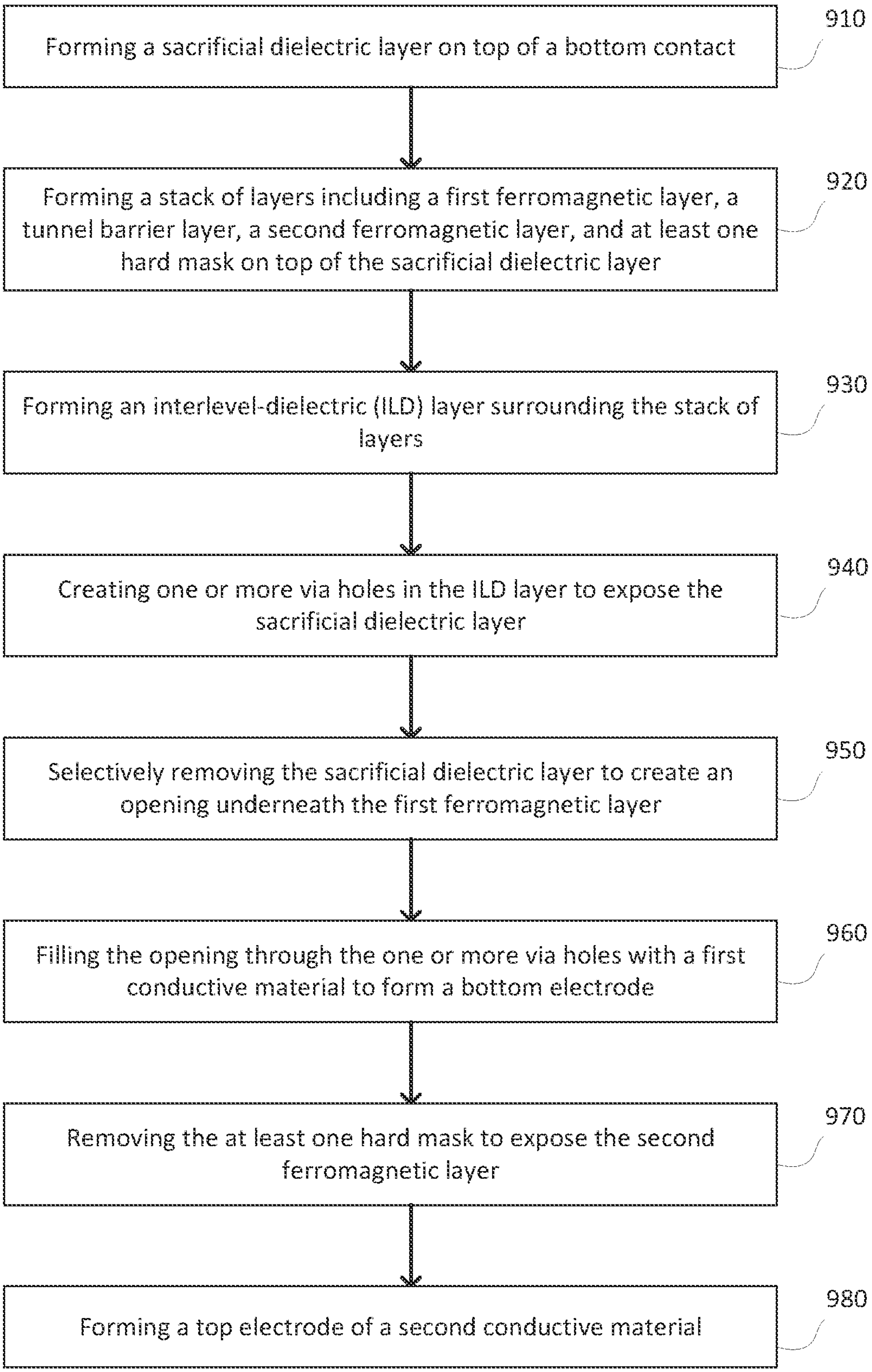
FIG. 19 is a demonstrative illustration of a flow-chart of a method of manufacturing a MRAM device according to embodiments of present invention.

FIG. 19 is a demonstrative illustration of a flow-chart of a method of manufacturing a MRAM device according to embodiments of present invention. The method includes (910) forming a sacrificial dielectric layer on top of a bottom contact; (920) forming a stack of layers that include, from a bottom to a top thereof, a first ferromagnetic layer, a tunnel barrier layer, a second ferromagnetic layer, and at least one hard mask on top of the sacrificial dielectric layer; (930) forming an interlevel-dielectric (ILD) layer surrounding the above stack of layers; (940) creating one or more via holes in the ILD layer to expose the underneath sacrificial dielectric layer; (950) selectively removing the sacrificial dielectric layer to create an opening underneath the first ferromagnetic layer; (960) filling the opening with a first conductive material through the one or more via holes to form a bottom electrode; (970) removing the at least one hard mask to expose a top surface of the second ferromagnetic layer; and (980) forming a top electrode of a second conductive material on top of the second ferromagnetic layer, with the top electrode being embedded and/or surrounded by the ILD layer.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A MRAM structure comprising:

a magnetic tunnel junction (MTJ) stack, the MTJ stack includes, from a bottom to a top thereof, a bottom electrode; a first ferromagnetic layer; a tunnel barrier layer; a second ferromagnetic layer; and a top electrode; and a dielectric liner in physical contact with a sidewall of the first ferromagnetic layer, a sidewall of the tunnel barrier layer, and a sidewall of the second ferromagnetic layer, the dielectric liner being directly above and in physical contact with the bottom electrode, wherein the top electrode has a first portion directly above the second ferromagnetic layer and a second portion vertically outside the second ferromagnetic layer, a bottom surface of the first portion of the top electrode and a bottom surface of the second portion of the top electrode are at two different levels, and the dielectric liner in physical contact with at least a lower portion of the first portion of the top electrode.

2. The MRAM structure of claim 1, wherein the second portion of the top electrode is separated from the second ferromagnetic layer by the dielectric liner.

3. The MRAM structure of claim 1, wherein the MTJ stack is surrounded by an interlevel-dielectric (ILD) layer, the ILD layer having one or more via holes that are partially filled with part of the second portion of the top electrode.

4. The MRAM structure of claim 1, wherein the top electrode has a same material composition as the bottom electrode.

5. The MRAM structure of claim 1, further comprising a bottom contact and a conductive cap between the bottom electrode and the bottom contact, wherein the bottom contact is a metal level of a back-end-of-line (BEOL) structure.

6. A MRAM structure comprising:

a magnetic tunnel junction (MTJ) stack, the MTJ stack comprises:

a bottom electrode;

a first ferromagnetic layer on top of the bottom electrode;

a tunnel barrier layer on top of the first ferromagnetic layer;

a second ferromagnetic layer on top of the tunnel barrier layer; and a top electrode, wherein the top electrode is horizontally larger than the second ferromagnetic layer and on top of the second ferromagnetic layer, the top electrode having a bottom surface and at least a portion of the bottom surface being below a level of a top surface of the second ferromagnetic layer, and wherein a sidewall of the first ferromagnetic layer, a sidewall of the tunnel barrier layer, and a sidewall of the second ferromagnetic layer are in contact with a dielectric liner, at least a portion of the top electrode is in contact with the dielectric liner, and a sidewall of the dielectric liner is vertically aligned with a sidewall of the bottom electrode.

7. The MRAM structure of claim 6, wherein the at least a portion of the bottom surface of the top electrode is horizontally separated from the second ferromagnetic layer by the dielectric liner, the dielectric liner being in physical contact with the bottom electrode.

8. The MRAM structure of claim 6, wherein the dielectric liner has a vertical height above the top surface of the second ferromagnetic layer, and a portion of the top electrode above the top surface of the second ferromagnetic layer is surrounded by at least a portion of the dielectric liner that is surrounded by another portion of the top electrode that is vertically outside the second ferromagnetic layer.

9. The MRAM structure of claim 6, wherein the top electrode comprises a material selected from a group consisting of tantalum-nitride (TaN) and titanium-nitride (TIN), and the bottom electrode has a same material composition as the top electrode.

10. The MRAM structure of claim 6, wherein the first ferromagnetic layer is a reference layer, and the second ferromagnetic layer is a free layer.

11. The MRAM structure of claim 6, further comprising a top contact, the top contact having a flat bottom surface in contact with a top surface of the top electrode, wherein the top contact is a metal level of a back-end-of-line (BEOL) structure.

* * * * *